(12) United States Patent
Umeda et al.

(10) Patent No.: US 6,395,575 B1
(45) Date of Patent: May 28, 2002

(54) METHOD OF MANUFACTURING SENSOR AND RESISTOR ELEMENT

(75) Inventors: Shinji Umeda, deceased, late of Takefu, by Ieo Umeda, heir; Koji Nomura, Shijonawate; Akihiko Ibata, Takaishi; Hiroshi Fujii, Hirakata; Takeshi Masutani, Moriguchi, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/463,144

(22) PCT Filed: May 20, 1999

(86) PCT No.: PCT/JP99/02665

§ 371 (c)(1),
(2), (4) Date: Jul. 11, 2000

(87) PCT Pub. No.: WO99/61870

PCT Pub. Date: Dec. 2, 1999

(30) Foreign Application Priority Data

May 22, 1998 (JP) ............................................ 10-140892

(51) Int. Cl.⁷ .............................................. H01L 21/00
(52) U.S. Cl. ........................................ 438/54; 438/210
(58) Field of Search ........................... 438/48, 59, 134, 438/210, 54; 324/417, 415; 73/1.37, 1.59, 777

(56) References Cited

U.S. PATENT DOCUMENTS

| | | | | |
|---|---|---|---|---|
| 3,987,311 A | * | 10/1976 | Thornburg | 307/221 |
| 5,338,690 A | * | 8/1994 | Fukaya et al. | 438/59 |
| 5,352,895 A | * | 10/1994 | Inoue | 250/338.3 |
| 5,576,222 A | * | 11/1996 | Arai et al. | 438/59 |
| 6,017,775 A | * | 1/2000 | Igel et al. | 438/48 |

FOREIGN PATENT DOCUMENTS

| | | |
|---|---|---|
| JP | 4-344430 | 1/1992 |
| JP | 4-357891 | 10/1992 |
| JP | 5-1947 | 8/1993 |
| JP | 5-296830 | 12/1993 |

OTHER PUBLICATIONS

Sergent, J.E. and Harper, C.A.; Hybrid Microelectronics Handbook, Second Edition, McGraw–Hill, Inc. 1995, pp. 11–78.*

* cited by examiner

Primary Examiner—John F. Niebling
Assistant Examiner—Christophe Lattin
(74) Attorney, Agent, or Firm—McDermott, Will & Emery (57) ABSTRACT

A sensor in which a field effect transistor element 3 having a gate electrode 6 on its rear side is electrically connected onto a resistive element 2 having a top surface electrode and a bottom surface electrode in such a way that the gate electrode 6 and a portion of the top surface electrode of the resistive element 2 coincides, and a grounding electrode 12 on a substrate is electrically connected with the bottom surface electrode of the resistive element 2 so that they coincides.

13 Claims, 5 Drawing Sheets

METHOD OF MANUFACTURING SENSOR AND RESISTOR ELEMENT

FIELD OF THE INVENTION

The present invention relates to construction and method of manufacturing of electronic components such as infrared sensors for use, for example, in thermometers and human body detecting sensors, and piezoelectric devices for use, for example, in acceleration sensors and the like. In particular, it relates to a method of manufacturing sensors which are useful for electronic components in general in which circuit structures required for impedance conversion by using field effect transistor elements and the like have been mounted, and resistive elements for use in these sensors

BACKGROUND OF THE INVENTION

Figure 5:
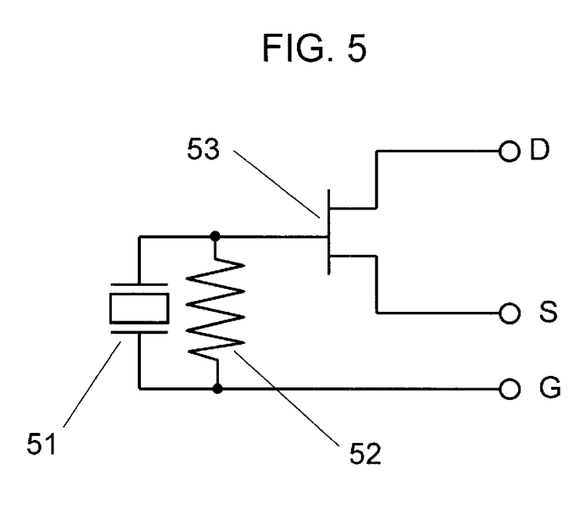
FIG. 5 is a circuit diagram of an impedance conversion circuit of a sensor.

There exist many electronic components such as various types of sensors which require impedance conversion by means of field effect transistor elements and the like when outputting signal after amplifying a minute signal generated by the sensor. FIG. 5 shows an impedance conversion circuit employing a sensing element 51 and a field effect transistor element 53.

In the impedance conversion circuit of FIG. 5, sensing element 51 is connected in series with a resistor 52, and the output of sensing element 51 is connected to the gate of field effect transistor element 53. In a sensor generating a very small electrical signal, (e.g.,resistor 52) with a rather high resistance value ranging from several tens of Mohms to several Tohms is used in many cases depending on the type of sensor.

Figure 6:
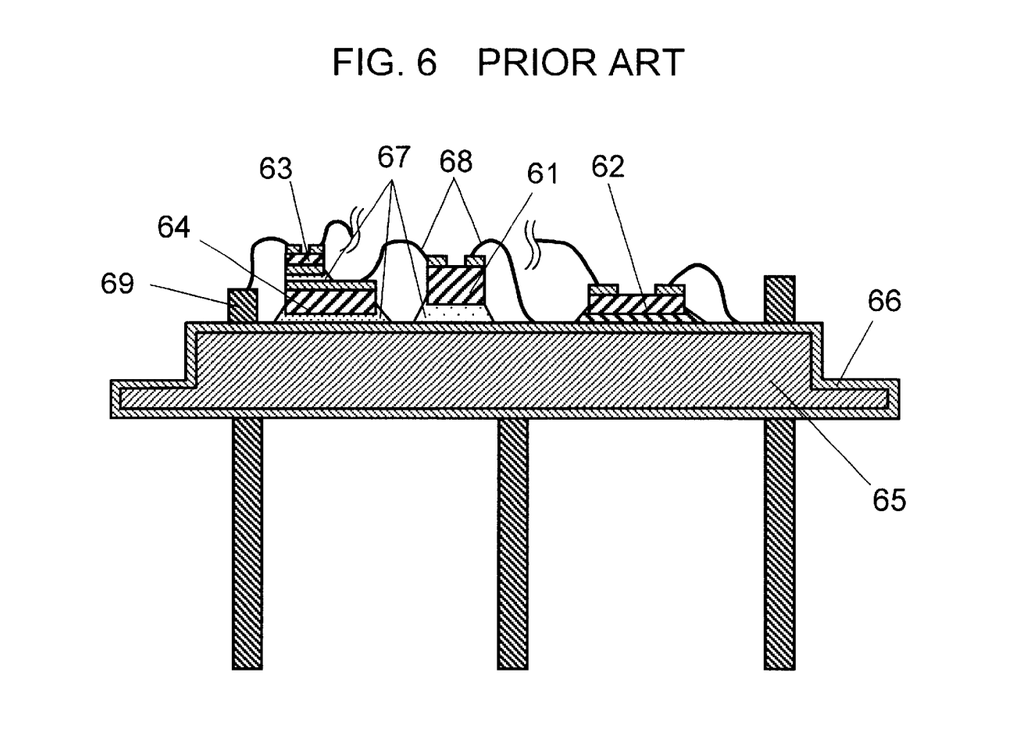
FIG. 6 is a cross-sectional view of a prior art sensor.

FIG. 6 shows a view illustrating the mounting on a stem of the circuit of FIG. 5. Four components are to be mounted, namely, a sensing element 61, a resistive element 62, a field effect transistor element 63, and a mounting board 64. In this configuration, the surface of a stem 65, which is the substrate for mounting, is covered with a metal, which operates as a grounding (GND) electrode 66. This is for the purpose of providing protection from external noises. Field effect transistor element 63 is formed on a silicon substrate, and an electrode operating as a gate terminal (G) is formed on the rear surface of the chip whereas a source electrode (S) and a drain electrode (D) are formed on the top surface of the chip.

From the standpoint of circuit configuration, it is impossible to dispose field effect transistor element 63 directly on stem 65. Consequently, it is first connected via a conductive resin 67 on mounting board 64 which is provided with a connecting electrode on the top surface. While bonding of components other than field effect transistor element 63 does not require a conductive resin, the same conductive resin 67 is generally used for simplifying the mounting process. The connection between electrodes of each elements and substrate electrodes is performed by wire bonding using thin metal wires 68 of Al or Au, and then to an external terminal 69.

As has been described above, the conventional canned package has as many as four components that need to be mounted, calling for six wires to be wire bonded. Accordingly, the use of many components means not only a high materials cost but also an increase in man-hours for the mounting process resulting in a high cost. Also, as a space is required on the stem, a larger stem is required, thereby making the sensor size larger.

The present invention addresses these issues and aims at realizing a lower sensor cost as well as providing a smaller package.

SUMMARY OF THE INVENTION

In addressing the above issues, the present invention provides a method of manufacturing a sensor comprising a resistive element having a top surface electrode and a bottom surface electrode, a sensing element generating an electrical signal by sensing energy from the outside, a field effect transistor element on the rear side of the chip of which a gate electrode is formed, and a substrate having a first electrode, a second electrode, and a third electrode on its top surface, the method comprising the steps of electrically connecting the bottom surface electrode of the resistive element and first electrode of the substrate, electrically connecting the field effect transistor element onto the resistive element so that the gate electrode and a portion of the top surface electrode of the resistive element meet, electrically connecting one of the electrodes of the sensing element and a portion of the top surface electrode of the resistive element, electrically connecting the source and drain electrodes of the field effect transistor element respectively to the second electrode and the third electrode on the substrate, and electrically connecting the other electrode of the sensing element to the first electrode on the substrate. With this invention, the mounting board of the prior art example becomes unnecessary and the number of wires is reduced from 6 to 4 thereby reducing the cost. Also, as a resistive element is disposed at a position where a mounting board is disposed in the prior art, the space occupied by the resistive element becomes unnecessary thus providing a smaller package.

The present invention also provides a sensor in which the resistive element of the above described sensor is formed with a ceramic material, glass material, or the like, or ferrite material, and in which a resistor body having a relatively high resistance value in the range from several tens of Mohms to several Tohms can be formed with ease.

The present invention also provides a method of manufacturing a resistive element having a predetermined resistance value by forming in advance an electrode over the entire top and bottom surfaces of a flat resistor body with a large area and cutting to arbitrary dimensions after measuring the resistance value. According to this invention, as the resistance value is inversely proportional to the area of the electrode, it is possible to change the resistance value by the size to be cut based on the resistance value measured in advance when the area is large, thereby allowing formation of a resistive element having a precise resistance value which is intended to be obtained after cutting. Also, by changing the area to be cut, it is possible to obtain resistive elements having many types of resistance values from the same resistor body. Furthermore, it is a method of manufacturing with superiority in mass producibility as it is possible to configure a continuous mounting process from cutting to mounting by employing a cutting method such as dicing or the like. The present invention also provides a method of manufacturing resistive elements in which the resistor body to be used for the resistive elements is formed at a sintering temperature such that the rate of water absorption becomes 1% or less. According to this invention, even when a process in which cutting of the resistor body to be used for resistive elements is diced while water is being sprayed, no change in the resistance value due to water absorption or moisture absorption by the resistor body occurs. It is also possible to realize a high reliability resistive elements as no change in the resistance value is caused even under a high-temperature, high-humidity environment.

Furthermore, in the present invention, the method of manufacturing the above described sensor is one in which the resistive element is simply a resistive element of which the electrodes are formed on the top and bottom surfaces of the resistor body, a first electrode on a substrate is electrically connected with the bottom surface electrode of the resistive element via an conductive material, and a predetermined resistance value is obtained by controlling the amount of the conductive material so as to control the amount of resin which rises on the sides of the resistor body. With this invention, it is possible to correct the resistance value by controlling only the amount of resin to be coated even when there is some variation in the obtained resistance values among production lots.

The present invention also provides a method of manufacturing a resistive element having a predetermined resistance value in which the resistance value is controlled by heat treating a resistive element of the above described sensor in a vacuum, in a reducing gas atmosphere, or in an inactive gas atmosphere after forming the top surface and bottom surface electrodes. According to the present invention, as it is possible to change the resistance value of the resistive elements fabricated by the same method of manufacturing over a wide range, it makes it possible to configure resistor bodies having many types of resistance values from a resistor element fabricated by the same method of manufacturing. It is also possible to change the resistance value of a resistor body after mounting.

In the method of manufacturing the above resistive element, the present invention provides a method of manufacturing in which resistive elements are fabricated by heat treatment in the atmosphere or in an oxygen atmosphere after heat treatment in a vacuum, reducing gas atmosphere, or inactive gas atmosphere. According to this invention, it is possible to fabricate stable and high-reliability resistive elements of which the resistance value does not change during mounting of the above-configured resistive elements or during heat treatment after mounting.

Furthermore, in the present invention, the electrodes to be formed on the top and bottom surfaces of a resistive element are made of a metal containing either of chromium, tin, or indium. According to this invention, even when a resistor body formed with a ceramic material, glass material, or ferrite material has a resistance value close to that of an insulator, it is possible to further widen the variable range of the resistance value in the above configured resistive elements by employing a metal containing either of chromium, tin, or indium as the electrode of the resistor body.

DESCRIPTION OF THE PREFERRED EMBODIMENTS

First Exemplary Embodiment

Referring to the drawings, a description of a first exemplary embodiment of the present invention is set forth below.

Figure 1:
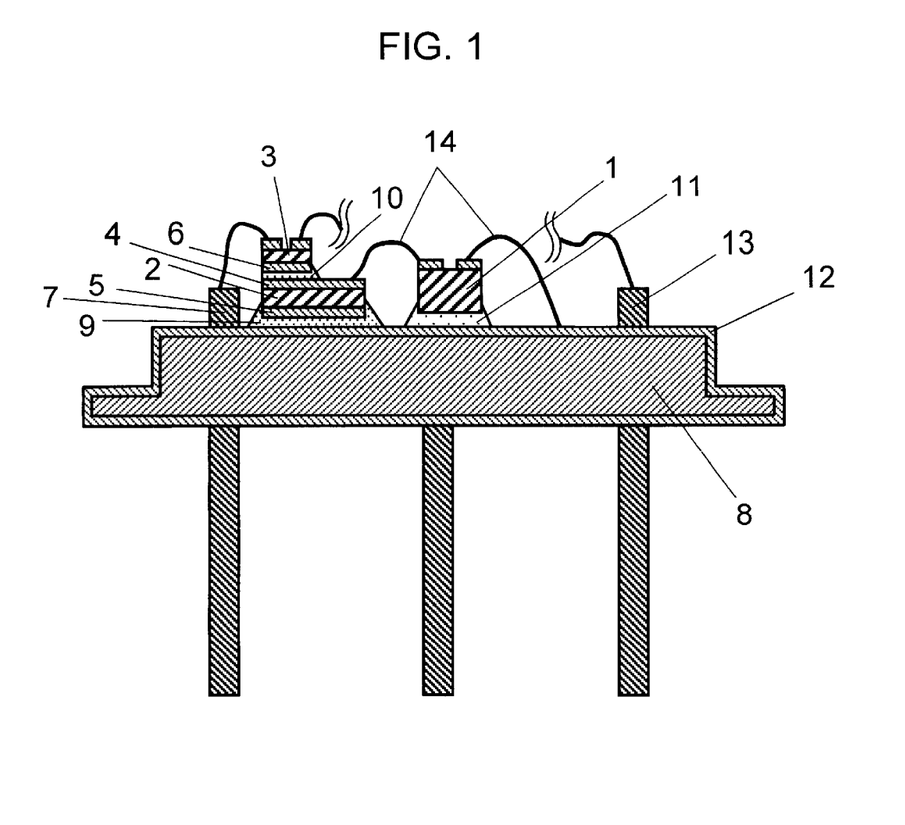
FIG. 1 is a cross-sectional view of a sensor in a first exemplary embodiment of the present invention.

FIG. 1 shows a cross-sectional view of a sensor of the present embodiment. In FIG. 1, a sensing element 1 is a sensing element which generates an electrical signal by sensing external energy or stimulus such as from an infrared sensor, pressure sensor, or shock sensor. Sensing element 1 usually has multiple output terminals. A resistive element 2 has a top surface electrode 4 and a bottom surface electrode 5. In a sensor generating a very small electrical signal, a relatively high resistance value is required. A gate electrode 6 is formed on the rear surface of a field effect transistor element 3, and a source electrode and a drain electrode are formed on the top surface. The surface of a stem 8, which is a substrate for mounting, is covered with a metal that forms a grounding (GND) electrode as is the case with a stem 65 of the prior art in FIG. 6. Sensing element 1 is secured onto stem 8 with a die bonding resin 11 or the like. Generally, die bonding resin 11 contains an insulating or a conductive filler.

Subsequently, resistive element 2 is secured on top of the grounding electrode 12 on stem 8 with an conductive material 9 so as to connect its bottom surface electrode 5 of resistive element 2 with the grounding electrode 12, followed by securing field effect transistor element 3 on top of resistive element 2 with the a conductive material 10. During this process, the configuration is arranged so that a portion of top surface electrode 4 of resistive element 2 and gate electrode 6 become mutually electrically conducting. Conductive materials 9 and 10 are, for example, a die bonding resin containing a conductive filler. Die bonding resin 11 and conductive materials 9 and 10 can be a common material.

Next, the structure of the device is such that one of the electrodes of sensing element 1 and a portion of top surface electrode 4 of resistive element 2 are electrically connected, and the other electrode of sensing element 1 and grounding electrode 12 are electrically connected. The source electrode and drain electrode on field effect transistor element 3 are respectively connected to a second electrode 7 and a third electrode 13 on stem 8. Generally, these connections are performed by employing wire bonding methods in which electrodes are connected by a fine metal wire 14 similarly to the prior art example illustrated in FIG. 6.

According to this sensor configuration, the mounting board 64 on which mounting is performed in the prior art becomes unnecessary and the number of wires is reduced from 6 to 4, thus resulting in a lower cost. Furthermore, as the resistive element is positioned in the place where the mounting board was positioned in the prior art, the space occupied by the resistive element becomes unnecessary, thus a smaller package can be realized.

In a sensor in which a very small amount of electrical signal is to be output, the resistance of resistive element 2 has to be an extremely high value in the range from several hundreds of Mohms to several Tohms. Such high resistance values can be realized by using sintered bodies such as ceramic materials, glass materials, and ferrite materials, or the like, which have higher resistance values than that of usual carbon based resistor bodies.

Second Exemplary Embodiment

Figure 2A:
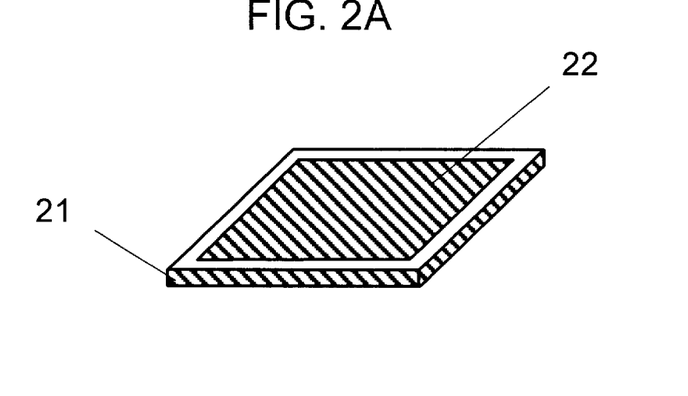
FIGS. 2A to 2C are views illustrating the method of manufacturing a resistive element in a second exemplary embodiment of the present invention.
Figure 2B:
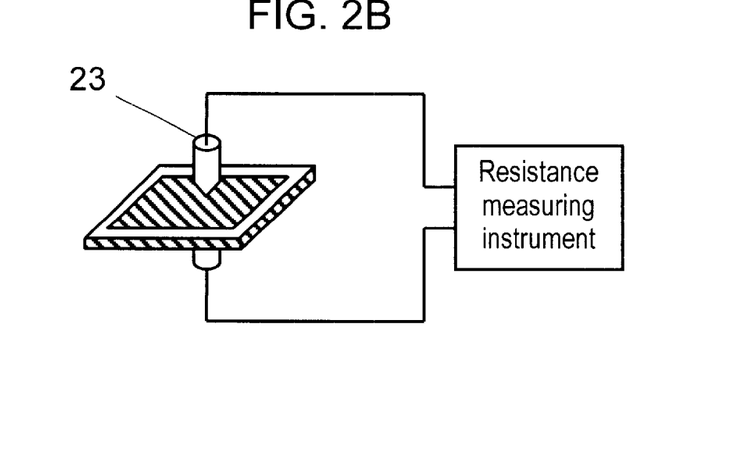
Figure 2C:
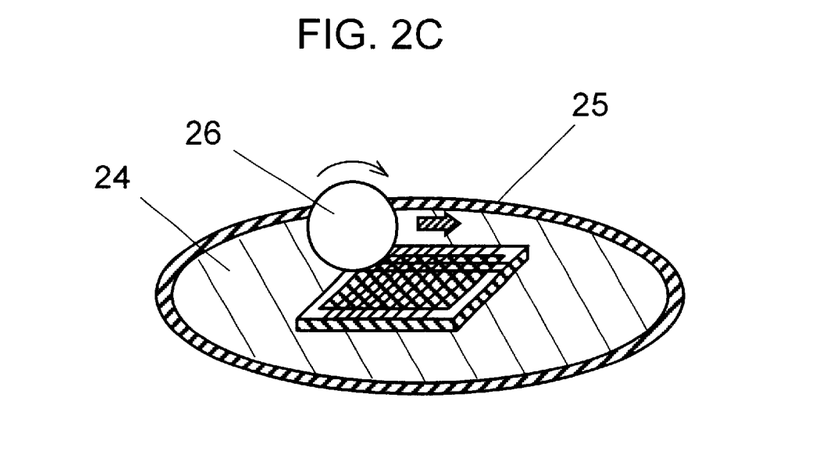

FIGS. 2A to 2C illustrate the method of manufacturing resistive elements in a second exemplary embodiment of the present invention. Specifically, FIG. 2A–2C illustrate the method of manufacturing the resistive element described in the first exemplary embodiment. FIG. 2A shows the process of forming electrodes 22 on the top and bottom surfaces of a flat resistor body 21. Several methods are available for the formation of the electrodes, for example, a method of forming relatively thin films by, for example, vacuum deposition and sputtering, or the like, and a method of forming relatively thick films by, for example, plating. Also, a method in which the electrodes are formed by printing prior to firing a resistor body has the advantage of being superior in mass producibility. As it is necessary to make electrical connections in the subsequent process with a conductive resin or by wire bonding method, it is effective to form Au, which does not form an oxide film, over the outermost surface of the metal to be used as the electrode.

FIG. 2B shows the process of measuring the resistance value by making a contact electrode 23 come in contact with the top surface and the bottom surface electrodes. Since the resistance value is inversely proportional to the electrode area, it is possible to precisely predict in advance the resistance value of a resistive element after it has been cut by measuring the resistance value of the electrode with a large area before cutting. In other words, even when the resistance value of a resistor body deviates to a certain extent, it is possible to fabricate a resistive element having a precise resistance value by adjusting the size to be cut.

For cutting, a dicing method as illustrated in FIG. 2C is often utilized. First, a sticky dicing tape 24 is laminated on a dicing ring 25, and a resistor body to be diced is made to stick on top of the tape. Cutting is performed by subsequently moving a dicing blade 26 which is revolving at a high speed on the resistor body. During this process, water is sprayed to dicing blade 26 in order to reduce the friction between the dicing blade and the resistor body. Also, the system is so configured that the dicing ring itself can be installed on a mounting machine after cutting, thus allowing arrangement of the resistor up to the mounting process.

According to this method of manufacturing resistive elements, it is possible to predict the relationship between the size to be cut and the resistance value of a resistive element after being cut by making a measurement in advance of the resistance value of the resistor body when the area is large (e.g., prior to cutting). Consequently, a resistive element having a precise resistance value intended to be obtained after cutting can be formed. Also, by changing the area to be cut, resistive elements having many kinds of resistance values can be formed from the same resistor body. Furthermore, by employing a cutting method such as dicing and the like, a continuous mounting process from cutting through mounting can be configured, thus providing a method of manufacturing resistive elements with superior reproducibility.

The use of dicing for cutting, means that the resistive elements undergo a process of being immersed in water. In the event the resistive elements are porous and water absorbing or moisture absorbing, once water is absorbed, the resistance value becomes extremely low thus not indicating normal resistance values. For example, when the water absorption rate is 4%, the resistance value after water absorption decreases by about an order of magnitude. On the contrary, when the water absorption rate is 1% or less, there is little change in the resistance value. Therefore, the sintering temperature of the resistive elements is set at a relatively high temperature in order to lower the water absorption rate to 1% or less. This is also effective in keeping the resistance value stable under a high humidity environment.

Third Exemplary Embodiment

Figure 3:
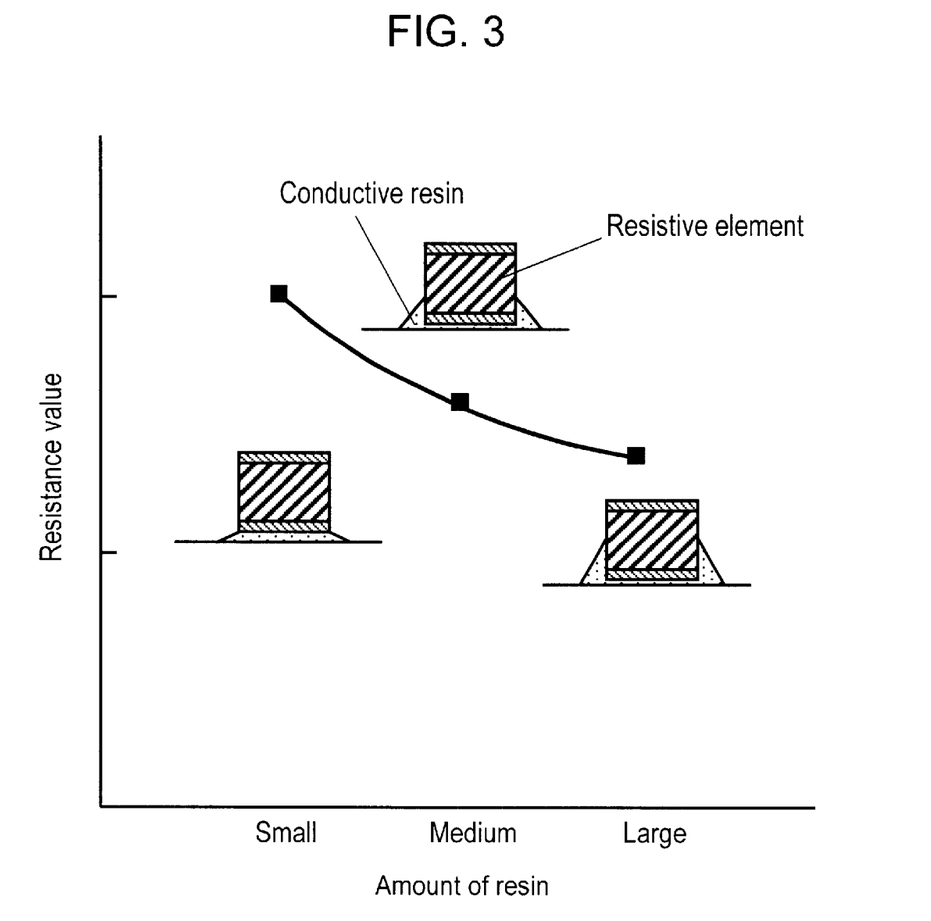
FIG. 3 is a graphical representation of the dependence of the resistance value on the amount of a conductive resin in a third exemplary embodiment of the present invention.

Referring now to FIG. 3, the method of manufacturing resistive elements in a third exemplary embodiment of the present invention will be given. FIG. 3 shows the dependence of the resistance value on the amount of the conductive resin when a resistive element on which only electrodes have been formed on the top and bottom surfaces of the resistor body (such as fabricated by the process described in the second exemplary embodiment) is secured on a substrate with a conductive resin. As shown in FIG. 3, the amount of resin which rises on the sides of the resistive element, increases with the increasing amount of the conductive resin. And, as the amount of the conductive resin that rises on the sides increases, the resistance value of the resistive element decreases. This is because the portion of the conductive resin which attaches to the sides functions like an electrode thus causing a state as if the electrode area has been enlarged or the distance between the top and bottom electrodes has been diminished thereby reducing the resistance. For coating the resin, a dispenser or a transfer tool is used as the coating apparatus, a certain amount of resin can be coated with a relatively good controllability.

In the present invention, in mounting a resistive element on a substrate, a predetermined resistance value is obtained by making the structure of the resistive element a simple. one obtained by forming electrodes on the top surface and bottom surface on a resistor body and controlling the amount of resin which rises on the sides of the resistive element through control of the amount of the conductive resin to be coated. According to this embodiment, it is possible to correct the resistance value by controlling only the amount of the resin to be coated even when there exists some variation in resistance values among the production lots.

Moreover, similar effects can be obtained when the conductive resin is replaced with a low-melting point metal such as solder.

Fourth Exemplary Embodiment

Figure 4:
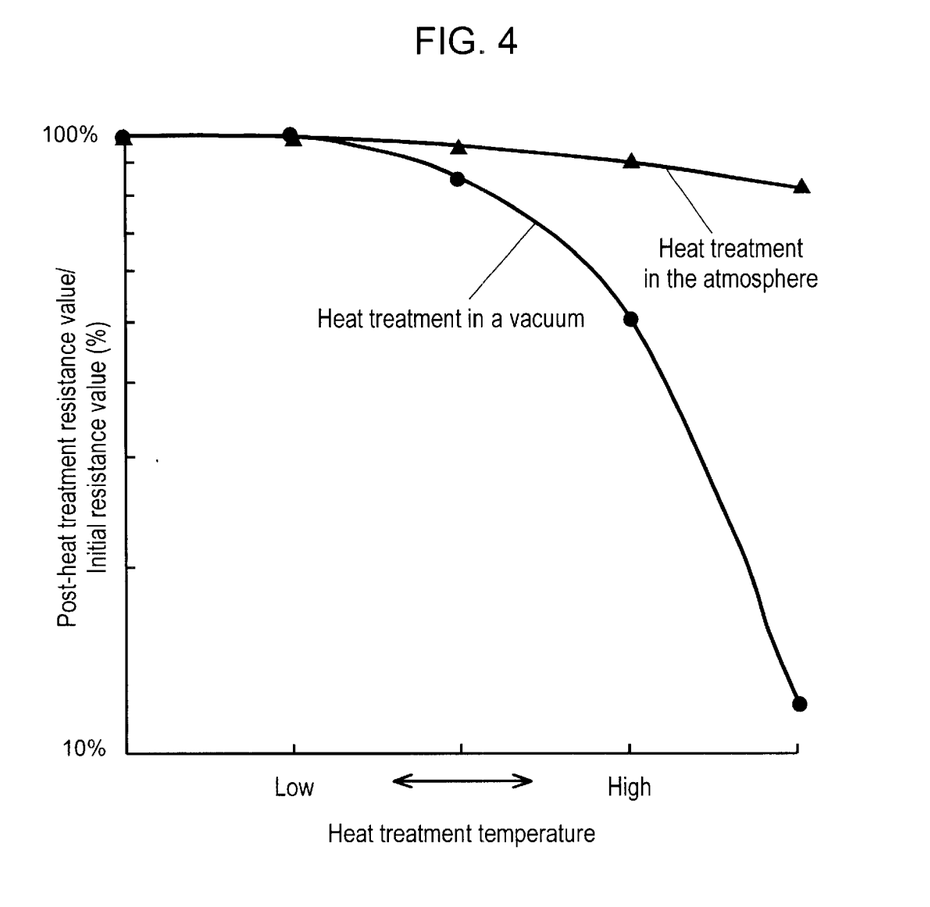
FIG. 4 is a graphical representation of heat treatment temperature dependence of the resistance value in a fourth exemplary embodiment of the present invention.

Referring to FIG. 4, the method of manufacturing resistive elements to be used in a sensor in a fourth exemplary embodiment of the present invention will be described. FIG. 4 is a representation of the effect of heat treatment when resistive elements are configured with a resistor body composed of a ceramic material, glass material, or ferrite material which is composed of metal oxides. As shown in FIG. 4, heat treatment temperature dependence of the resistance value is high when heat treatment is performed in a vacuum containing no oxygen. This is attributable to a decrease in the resistance value due to diffusion into the film of the metal contained in the electrode and to a change in the composition of the resistor body due to separation of oxygen contained in the resistor body as a result of heat treatment. On the other hand, when heat treatment is performed in the atmosphere, the resistance value does not change significantly as shown in FIG. 4. This is because diffusion of metal is deterred due to attraction by oxygen in the atmosphere or oxygen in the resistor body is difficult to be separated. Consequently, in the present invention, heat treatment is performed in a vacuum, reducing gas atmosphere, or inactive gas atmosphere in order to control the resistance value and to form resistive elements having a predetermined resistance value.

According to this invention, as it is possible to change the resistance value of resistive elements fabricated by the same method of manufacturing over a wide range, it is possible to fabricate resistor elements having many kinds of resistance values even with resistive elements fabricated by the same method of manufacturing and having the same size. As a result, even when the space for mounting a resistive element is limited, a resistive element having a predetermined resistance value and an arbitrary size can be fabricated. Furthermore, the resistance value of the resistor elements can be changed after being mounted.

However, when the resistance value is made extremely small, the resistance value sometimes gradually increases when the resistor elements are left standing in the atmosphere. This is because oxygen in the atmosphere is absorbed into the resistor bodies once again. Although the change is not too large, fluctuation of the resistance value is not desirable. Therefore, after decreasing the resistance value once by performing heat treatment in a vacuum, in a reducing gas atmosphere, or in inactive gas atmosphere, heat treatment is performed in the atmosphere or in an oxygen atmosphere. The temperature of the heat treatment is preferably the temperature to be experienced in the subsequent process or a temperature higher than the highest operating temperature of the sensor. Caution is to be taken especially when mounting the sensor because it is subjected to a relatively high temperature. With this method, stable and high reliability resistive elements can be configured. This method has also an added effect of minimizing resistance value dispersion enlarged by the decrease in the resistance value.

Use of a metal containing either of chromium, tin, or indium as the electrode material to be used in the resistive elements will provide a larger amount of resistance change due to heat treatment in a vacuum. This is because these metals are easy to diffuse into oxides. Especially when configuring an electrode by laminating plural metals, better effect of diffusion can be obtained by forming film of these metals closest to the resistor body. As tin and indium in particular exhibit electrical conductivity even when oxidized, the resistance change becomes greater. Resistance value of a ceramic material, glass material, or ferrite material, all being oxides, drastically decreases as the temperature rises. When the degree of resistance value decrease with temperature is large, it may cause some problems depending on the application and operating temperature range of the sensor. However, by diffusing these metals in the resistor body, the degree of resistance value decrease with temperature can be lessened.

According to the methods described in the above second to fourth embodiments, it is possible to precisely set the resistance value of a resistive element to be used in a sensor, thus enhancing the accuracy of the sensor and at the same time reducing the cost by raising the yield of the resistive element.

As has been set forth above, the present invention allows cost reduction as the number of wires can be reduced from 6 to 4 when compared with the prior art sensor configuration. Also, as a resistive element is disposed at a position where a mounting board is placed in the prior art, the space occupied by the resistive element becomes free thereby providing an advantageous effect of obtaining a smaller package. Furthermore, a sensor with a higher accuracy can be obtained as the resistance value of the resistive element can be precisely controlled.

Although certain specific embodiments of the present invention have been disclosed, it is noted that the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

REFERENCE NUMERALS

1. Sensing element
2. Resistive element
3. Field effect transistor element
4. Top surface electrode of resistor body
5. Bottom surface electrode of resistor body
6. Gate electrode
7. Second electrode,
8. Stem
9. Conductive material
10. Conductive material
11. Die bonding resin
12. Grounding electrode
13. Third Electrode
14. Thin metal wire
21. Resistor body
22. Electrode
23. Contact electrode
24. Dicing tape
25. Dicing ring
26. Dicing blade

What is claimed is:

1. A sensor including:
   a resistive element having a top surface electrode and a bottom surface electrode;
   a sensing element for sensing energy from outside and generating an electrical signal;
   a field effect transistor element in which a gate electrode is formed on a rear surface of a chip containing said field effect transistor element; and
   a substrate having a first electrode, a second electrode, and a third electrode on the top surface of said substrate;
   wherein:
   the bottom surface electrode of said resistive element is electrically connected with the first electrode of said substrate;
   the gate electrode of said field effect transistor element is disposed above the top surface electrode of the resistive element, said gate electrode being electrically connected with the top surface electrode of the resistive element by a conductive material;
   one of the electrodes of said sensor element is electrically connected with a portion of the top surface electrode of said resistive element;
   a source electrode and a drain electrode of said field effect transistor element are respectively electrically connected with the second electrode and the third electrode on said substrate; and
   the other electrode of said sensing element is electrically connected with the first electrode on said substrate.

2. The sensor of claim 1 wherein said resistive element is formed with one of a ceramic material, glass material, and ferrite material.

3. The sensor of claim 1 wherein the top surface electrode and the bottom surface electrode of said resistive element contain at least one of chromium, tin, and indium.

4. A method of manufacturing a sensor, said sensor including:
   a resistive element having a top surface electrode and a bottom surface electrode;

a sensing element for sensing energy from outside and generating an electrical signal;

a field effect transistor element on which a gate electrode is formed on a rear surface of a chip containing said field effect transistor element; and a substrate having a first electrode, a second electrode, and a third electrode on the top surface of said substrate;

said method comprising the steps of:

electrically connecting the bottom surface electrode of said resistive element with the first electrode of said substrate;

electrically connecting the gate electrode of said field effect transistor element to a portion of the top surface electrode of said resistive element by a conductive material, said gate electrode being disposed above the top surface electrode of the resistive element, said gate electrode being separated from the top surface electrode of the resistive element by the conductive material;

electrically connecting one of the electrodes of said sensing element with a portion of the top surface electrode of said resistive element;

electrically connecting a source electrode and a drain electrode of said field effect transistor element with the second electrode and the third electrode on said substrate, respectively; and electrically connecting the other electrode of said sensing element with the first electrode on said substrate.

5. The method of manufacturing a sensor of claim 4 wherein the method of manufacturing said resistive element comprises the steps of:

forming an electrode over the entire top and bottom surfaces of a large-area flat resistor body in advance;

measuring its resistance value; and cutting said resistor body to predetermined dimensions based on the measured resistance value to obtain a predetermined resistance value.

6. The method of manufacturing a sensor of claim 5 wherein said resistor body is formed by sintering at a temperature at which the water absorption rate becomes 1% or less.

7. The method of manufacturing a sensor of claim 4 wherein the step of electrically connecting the bottom surface electrode of said resistive element with the first electrode of said substrate further comprising:

obtaining a predetermined resistance value by electrically connecting the bottom surface electrode of said resistive element with the first electrode of said substrate by using a conductive material and controlling the amount of the conductive material, thereby controlling the amount of resin that rises on the sides of said resistive element.

8. The method of manufacturing a sensor of claim 4, further comprising the step of:

obtaining a predetermined resistance value by controlling the resistance value and forming a resistive element having a predetermined value by performing at least one of heat treatment in a vacuum, heat treatment in a reducing gas atmosphere, and heat treatment in an inactive gas atmosphere, after forming the top surface electrode and the bottom surface electrode of said resistive element.

9. The method of manufacturing a sensor of claim 8, further comprising the step of:

performing heat treatment in the atmosphere or in an oxygen atmosphere after performing heat treatment in one of a vacuum, a reducing gas atmosphere, and an inactive gas atmosphere.

10. The sensor of claim 1, wherein said gate electrode disposed above said top surface electrode is separated from said top surface electrode only by said conducting material.

11. The method of manufacturing a sensor of claim 4, wherein said gate electrode disposed above said top surface electrode is separated from said top surface electrode only by said conductive material.

12. The sensor of claim 1, wherein said surface of said gate electrode disposed above said top surface electrode does not cover the entire surface of the top surface electrode.

13. The method of manufacturing a sensor of claim 4, wherein said surface of said gate electrode disposed above said top surface electrode does not cover the entire surface of the top surface electrode.

* * * * *